(12) United States Patent
Park et al.

(10) Patent No.: US 9,557,589 B2
(45) Date of Patent: Jan. 31, 2017

(54) DISPLAY DEVICE

(71) Applicant: LG Display Co., Ltd., Seoul (KR)

(72) Inventors: Mikyung Park, Goyang-si (KR); Wonjong Cho, Seoul (KR); Sumin Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 15 days.

(21) Appl. No.: 14/444,703

(22) Filed: Jul. 28, 2014

(65) Prior Publication Data

US 2015/0036074 A1 Feb. 5, 2015

(30) Foreign Application Priority Data

Jul. 31, 2013 (KR) ........................ 10-2013-0091067

(51) Int. Cl.
| | | |
|---|---|---|
| *G02F 1/1335* | (2006.01) | |
| *G02F 1/1333* | (2006.01) | |
| *G02B 5/30* | (2006.01) | |
| *H01L 27/32* | (2006.01) | |

(52) U.S. Cl.
CPC ........... *G02F 1/133308* (2013.01); *G02B 5/30* (2013.01); *G02F 1/133528* (2013.01); *H01L 27/3232* (2013.01); *G02F 2001/13332* (2013.01); *G02F 2001/133331* (2013.01); *G02F 2001/133388* (2013.01); *G02F 2201/50* (2013.01); *G02F 2202/28* (2013.01); *G02F 2203/60* (2013.01)

(58) Field of Classification Search
CPC ...................... G02F 1/133528; G02F 1/133536
See application file for complete search history.

(56) References Cited

U.S. PATENT DOCUMENTS

| | | | |
|---|---|---|---|
| 2003/0001988 A1* | 1/2003 | Maeda ................. | G02B 5/3033 349/96 |
| 2010/0165239 A1 | 7/2010 | Lee et al. | |
| 2012/0133859 A1 | 5/2012 | Cha et al. | |
| 2012/0169963 A1 | 7/2012 | Park | |
| 2012/0235048 A1 | 9/2012 | Kim et al. | |
| 2014/0133174 A1* | 5/2014 | Franklin .............. | G02B 6/0088 362/606 |

FOREIGN PATENT DOCUMENTS

| | | |
|---|---|---|
| CN | 102122095 A | 7/2011 |
| CN | 102393579 A | 3/2012 |
| CN | 102737548 A | 10/2012 |
| EP | 2 778 772 A2 | 9/2014 |
| WO | WO 2010/029811 A1 | 3/2010 |

OTHER PUBLICATIONS

European Patent Office, Search Report and Opinion, European Patent Application No. 14176683.2, Nov. 14, 2014, eight pages.
Chinese First Office Action, Chinese Application No. 201410369644.8, Aug. 30, 2016, 15 pages.

* cited by examiner

*Primary Examiner* — Phu Vu
(74) *Attorney, Agent, or Firm* — Fenwick & West LLP

(57) ABSTRACT

A display device has a front surface and sides connected to each other using the same material. The display device includes a display panel, a case member wrapping around the side of the display panel, and a polarizing plate, which is attached to a front surface of the display panel and connects the display panel with the case member. The polarizing plate includes a polarizer disposed at the front surface of the display panel and a base film, which connects the front surface of the display panel with the case member.

15 Claims, 18 Drawing Sheets

(a)

(b)

(a)

(b)

DISPLAY DEVICE

CROSS-REFERENCE TO RELATED APPLICATION

This application claims the benefit of Korean Patent Application No. 10-2013-0091067 filed on Jul. 31, 2013, which is incorporated herein by reference for all purposes as if fully set forth herein.

BACKGROUND OF THE INVENTION

Field of the Invention

Embodiments of the invention relate to a display device having a front surface and sides connected to each other using the same material.

Discussion of the Related Art

Examples of a flat panel display include a liquid crystal display (LCD), a plasma display panel (PDP), an organic light emitting diode (OLED) display, and an electrophoresis display (EPD). The liquid crystal display displays an image by controlling an electric field applied to liquid crystal molecules based on a data voltage. An active matrix liquid crystal display reduces its manufacturing cost and improves its performance with improved process technology and driving technology. The active matrix liquid crystal display is used for display devices including small-sized mobile devices and large-sized televisions.

Manufacturers of the flat panel display have made various attempts to implement a narrow bezel. The narrow bezel technology reduces a bezel, on which an image is not displayed at an edge of a display panel, thereby relatively increasing the size of an active screen, on which the image is displayed, as compared with other display panels of the same size. In general, because gate driver integrated circuits (ICs) are respectively disposed at left and right edges of the display panel, it is difficult to reduce left and right bezels of the display panel. Further, as shown in FIG. 1, because case members wrapping the display panel are installed at the edge of the display panel, it is difficult to reduce the left and right bezels of the display panel.

FIG. 1 is a cross-sectional view showing an edge of a liquid crystal module.

As shown in FIG. 1, a liquid crystal module includes case members 20 and 21 for joining a display panel 10 and a backlight unit (not shown) into one module. Polarizing plates 11 and 12 are respectively attached to an upper substrate and a lower substrate of the display panel 10.

The case members 20 and 21 include a guide panel 20 for supporting the display panel 10 at the bottom, a bottom cover (not shown), and a top case 21, which wraps around an upper edge of the display panel 10, the guide panel 20, and an edge of the bottom cover.

The guide panel 20 may be manufactured using a plastic injection material. The top case 21 and the bottom cover may be manufactured using a metal material. As shown in FIG. 2, the polarizing plate 11 is exposed to the outside at the front of the liquid crystal module, and the top case 21 is exposed to the outside at the sides of the liquid crystal module. The front surface and the sides of the liquid crystal module are separated as different components (i.e., the polarizing plate 11 and the top case 21). When they are enlarged, as shown in FIG. 2, the bezel of the display panel 10 is more apparent.

SUMMARY OF THE INVENTION

Embodiments of the invention provide a display device having a front surface and sides connected to each other using the same material.

In one aspect, a display device comprises a display panel, a case member configured to wrap around the side of the display panel, and a polarizing plate, which is attached to a front surface of the display panel and connects the display panel with the case member.

The polarizing plate includes a polarizer disposed at the front surface of the display panel and a base film, which connects the front surface of the display panel with the case member.

In another aspect, a display device comprises a display panel, a case member configured to wrap around the side of the display panel, a first polarizing plate, which is attached to a front surface of the display panel and connects the display panel with the case member, and a second polarizing plate attached to a back surface of the display panel. The first polarizing plate includes a polarizer disposed at the front surface of the display panel and a base film, which is attached to the polarizer and connects the front surface of the display panel with the case member. The second polarizing plate may include a base film. The base film of at least one of the first and second polarizing plates is stretched.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
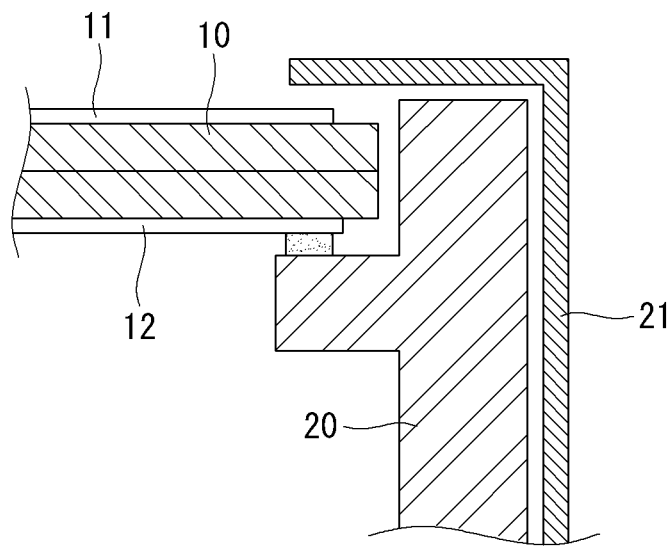
FIG. 1 is a cross-sectional view showing a portion of a liquid crystal module.
Figure 2:
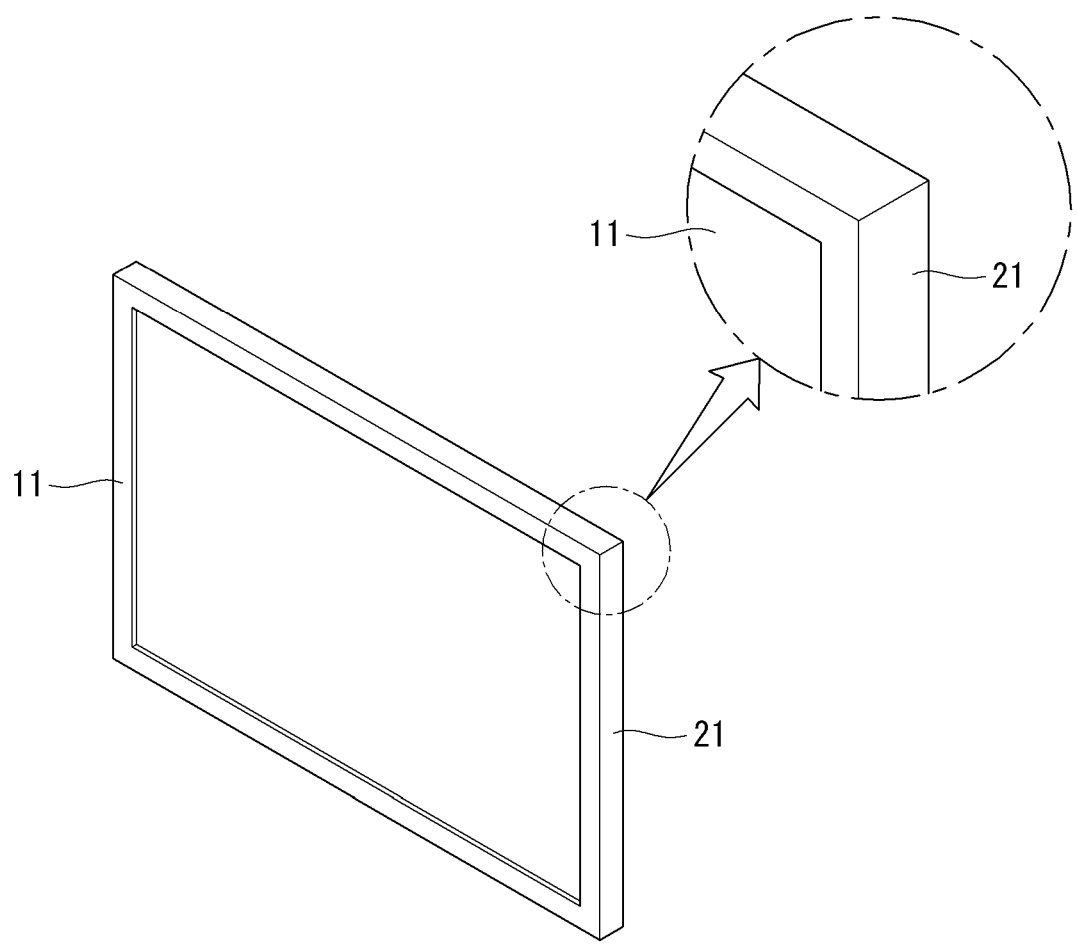
FIG. 2 is a perspective view of a liquid crystal module, of which a front surface and sides are separated as different components.

Reference will now be made in detail to embodiments of the invention, examples of which are illustrated in the accompanying drawings. Wherever possible, the same reference numbers will be used throughout the drawings to refer to the same or like parts. It will be noted that detailed description of known arts will be omitted where such description may obscure the embodiments of the invention.

An embodiment of the invention connects a front surface and sides of a display panel of a display device, for example, a liquid crystal display (LCD) or an organic light emitting diode display having a polarizing plate using a base film of the polarizing plate. In the following description, an embodiment of the invention is described using the liquid crystal display as an example of the display device having a polarizing plate. Other display devices may be used. For example, other display devices having a polarizing plate may be used.

As shown in FIGS. 8 to 19, a display device according to the embodiment of the invention includes a display panel 100, a case member wrapping around the sides of the display panel 100, and a polarizing plate 110, which is attached to a front surface of the display panel 100 and connects the display panel 100 to the case member. The polarizing plate 110 includes a polarizer 111 disposed at the front surface of the display panel 100 and one or more base films 112 and 113, which are attached to the polarizer 111 and connect the front surface of the display panel 100 with the case member. The case member includes a guide panel 200.

The base films 112 and 113 are designed to be wider than the polarizer 111. The base films 112 and 113 are attached to the polarizer 111 in a manner of wrapping around one surface or both surfaces of the polarizer 111. The base films 112 and 113 include an extension EA which bends from both ends of the display panel 100 and is attached to the side or a back surface of the case member.

The polarizer 111 has a predetermined stretching direction 111a. The base films 112 and 113 include a first base film 112 attached to a front surface of the polarizer 111 and a second base film 113 attached to a back surface of the polarizer 111. At least one of the first and second base films 112 and 113 includes the extension EA. The extension EA includes a black matrix BM 117.

The base films 112 and 113 are stretched. A stretching direction of the base films 112 and 113 is the same as a stretching direction 111a of a polarizing plate 120 attached to a back surface of the display panel 100.

Examples showing characteristics of the embodiment of the invention are described in detail below.

Figure 3:
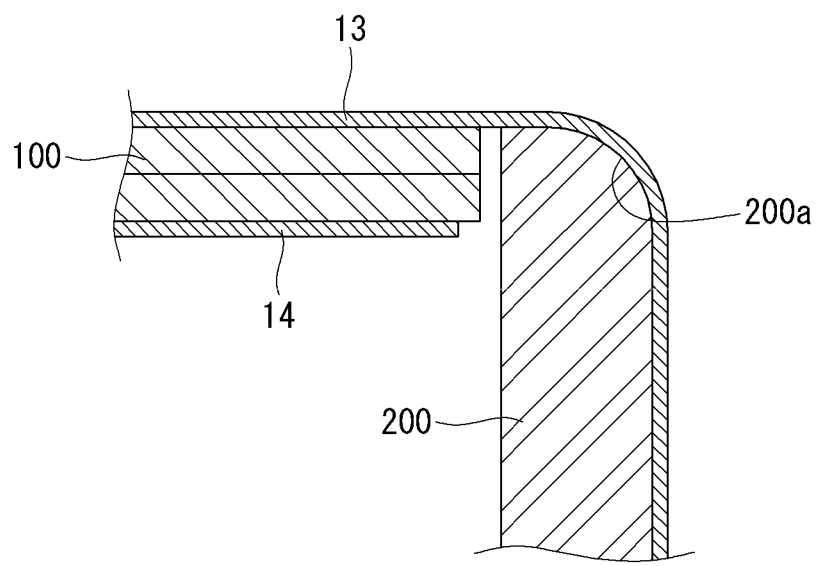
FIG. 3 is a cross-sectional view showing an example where a front surface and sides of a display device are connected to each other through a polarizing plate.
Figure 4:
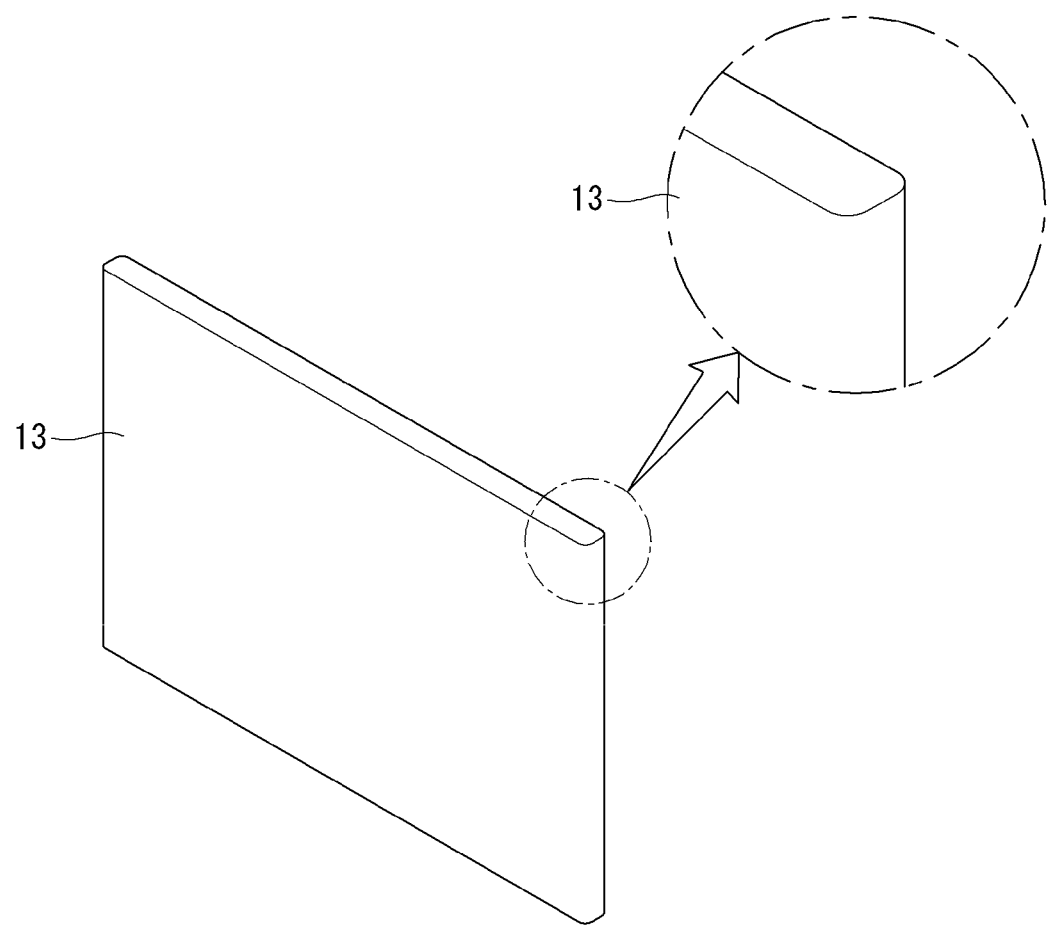
FIG. 4 is a perspective view showing an example where a front surface and sides of a display device are connected to each other through a polarizing plate.

FIGS. 3 and 4 show an example where a front surface and sides of a display device are connected to each other through a polarizing plate.

As shown in FIGS. 3 and 4, a display device includes a display panel 100 and a guide panel 200 supporting edges of the display panel 100.

The display panel 100 includes an upper substrate and a lower substrate, which are attached to each other with a liquid crystal layer interposed therebetween. Polarizing plates 13 and 14 may be respectively attached to the upper substrate and the lower substrate of the display panel 100. The upper polarizing plate 13 attached to the upper substrate extends to wrap around the guide panel 200. An upper surface of the guide panel 200 is formed as a curved surface 200a, to which the upper polarizing plate 13 is attached. A top case is omitted in the display device shown in FIGS. 3 and 4. As a result, the bezel of the display device may be reduced, and a front surface and sides of the display device may be smoothly connected through the polarizing plate 13.

As shown in FIGS. 3 and 4, when an extension of the polarizing plate 13 bends and is attached to the guide panel 200, the polarizing plate 13 is damaged or may be broken because the polarizing plate 13 has high elastic modulus and is brittle.

Figure 5:
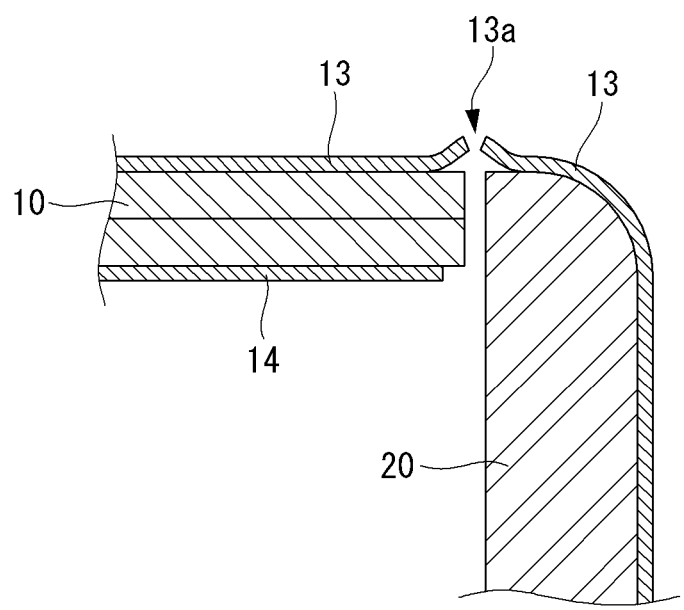
FIGS. 5 to 7 are cross-sectional views showing damage to a polarizing plate generated when a front surface and sides of a display device are connected to each other through the polarizing plate.

FIG. 5 shows an example where a bending portion of the polarizing plate 13 is broken (indicated by 13a in FIG. 5) or is cracked when an extension of the polarizing plate 13 bends and is attached to a guide panel 20. Light leaks through a broken portion 13a or through a cracked portion of the polarizing plate 13.

Figure 6:
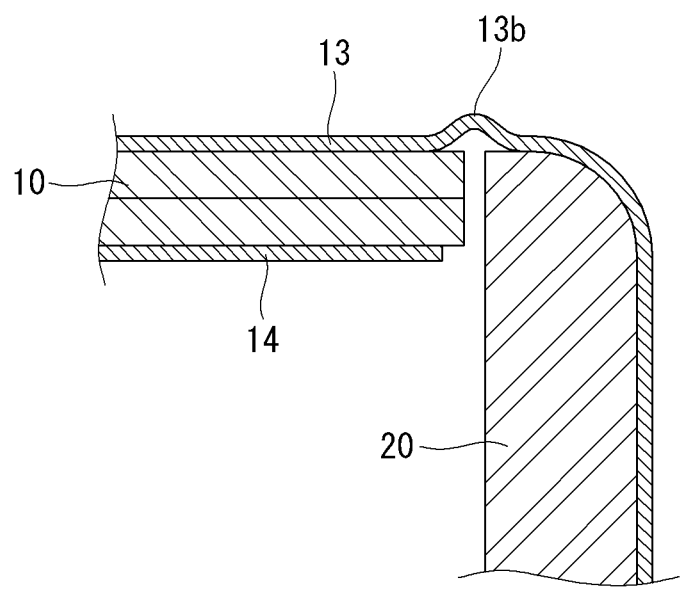
Figure 7:
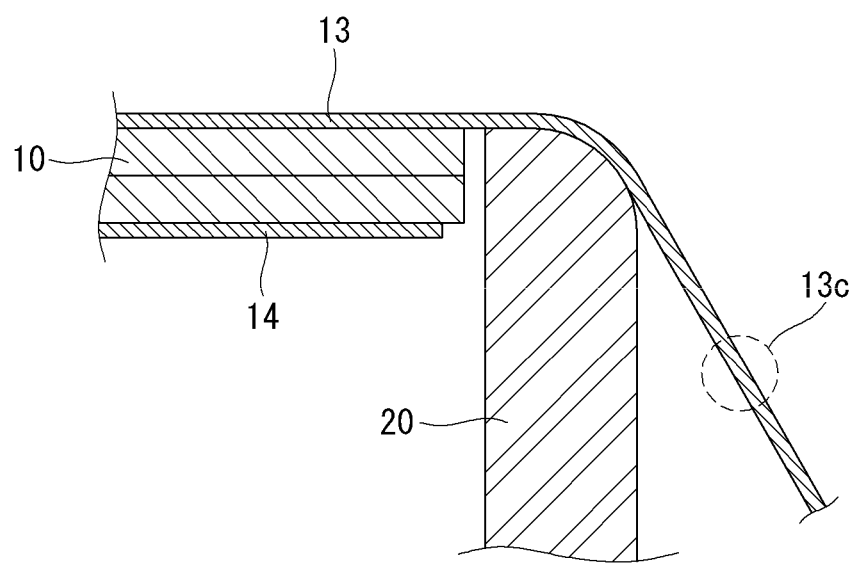

FIGS. 6 and 7 show an example where gaps 13b and 13c occur in a portion of the polarizing plate 13 when an extension of the polarizing plate 13 bends and is attached to a guide panel 20. Because the polarizing plate 13 has high elastic modulus and is thick, adhesive strength is reduced in a bent portion of the polarizing plate 13. Hence, the gaps 13b and 13c may occur. When the gap 13b occurs in the polarizing plate 13, the gap 13b expands a crack between the display panel 100 and the guide panel 20 as well as a crack between the display panel 100 and the polarizing plate 13. Hence, the extension of the polarizing plate 13 may be separated from the guide panel 20.

The polarizing plates 13 and 14 transmit light having a certain polarization and block other light. A method for manufacturing the polarizing plate stretches a film used as the polarizer, orients a polymer chain of the polarizer in a stretching direction, immerses the film in a solution obtained by mixing iodine ($I_2$) and a dichroic dye, and arranges iodine molecule and dichroic dye molecule in parallel with each other in the stretching direction, thereby obtaining the stretched polarizer. The polarizer may be manufactured using polyvinyl alcohol (PVA) film. Because the iodine molecule and the dye molecule have dichroism, the polarizing plate absorbs light vibrating in the stretching direction of the polarizing plate and transmits light vibrating in another direction (or a light transmission axis), thereby transmitting light having a certain polarization. The upper polarizing plate 13 and the lower polarizing plate 14 used in the liquid crystal display generally have stretching directions and light transmission axes perpendicular to each other.

Figure 8:
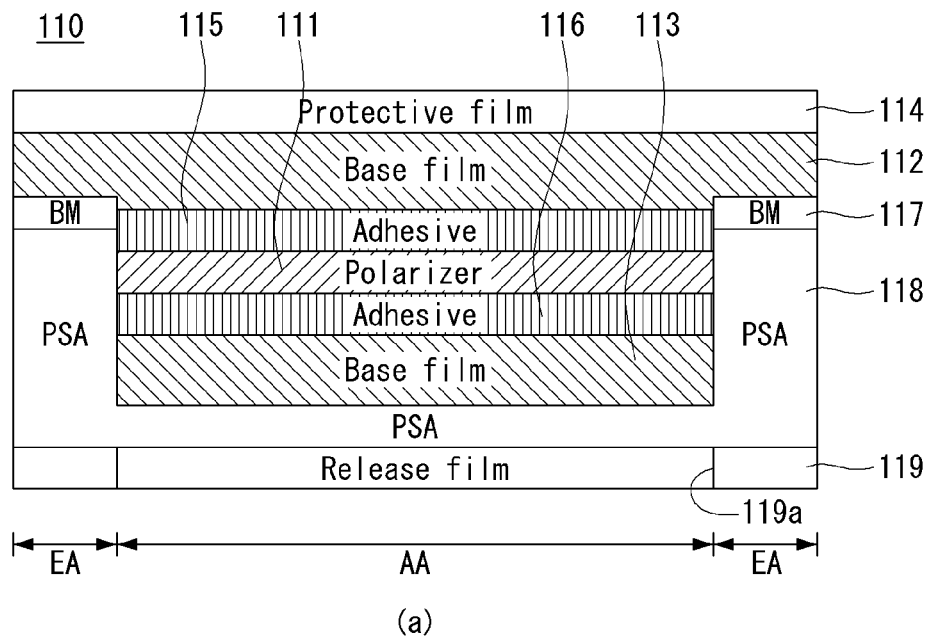
FIGS. 8 and 9 are each a cross-sectional view showing a polarizing plate according to an embodiment of the invention.
Figure 8:
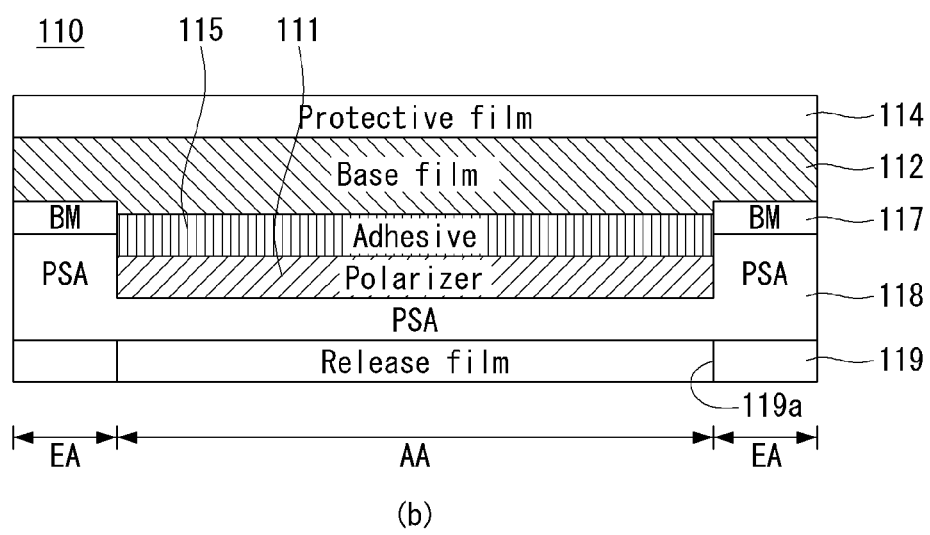
Figure 9:
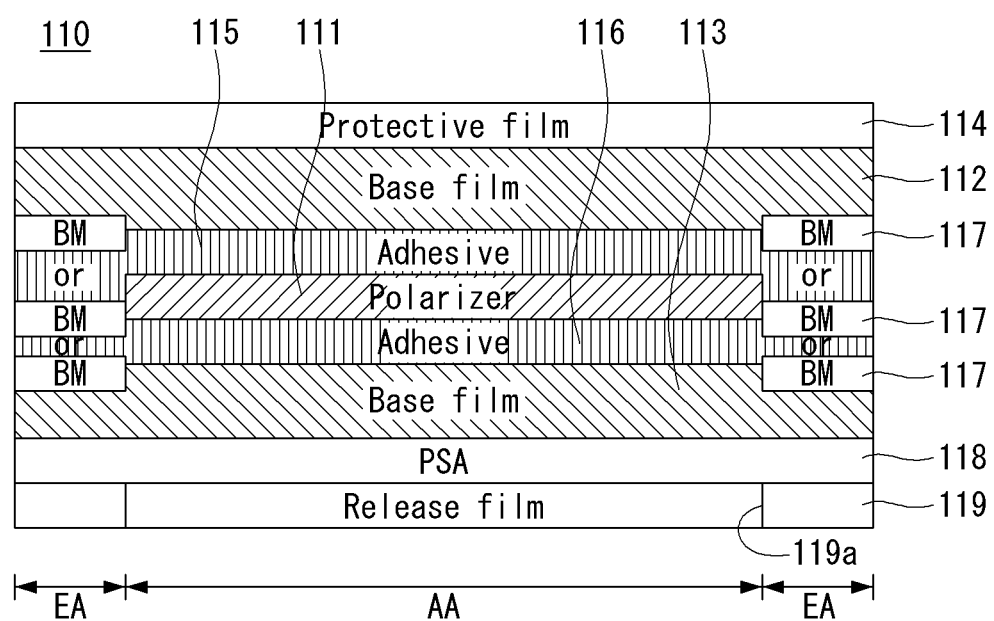

One embodiment of the invention changes the structure of the polarizing plate as shown in FIGS. 8 and 9 when the extension of the polarizing plate bends and is attached to the side of the display panel as shown in FIGS. 3 and 4, thereby preventing damage to the polarizing plate and light leakage.

FIGS. 8 and 9 are cross-sectional views showing a polarizing plate 110 according to an embodiment of the invention.

As shown in FIGS. 8 and 9, the polarizing plate 110 according to an embodiment of the invention includes the polarizer 111 and the first and second base films 112 and 113.

The polarizer 111 is designed to be suitable for the size of an active area AA. The active area AA is an area of a pixel array on the front surface of the display panel 100 on which an image is displayed. Thus, because the polarizer 111 is disposed at the front surface of the display panel 100, the polarizer 111 does not bend. PVA film may be used for the polarizer 111, or other films may be used. The polarizer 111 is attached between the first and second base films 112 and 113 using adhesives 115 and 116. A back surface of the first base film 112 is attached to a front surface of the polarizer 111. A front surface of the second base film 113 is attached to a back surface of the polarizer 111. The base film may be configured as one sheet or two sheets. As shown in (a) of FIG. 8, the two base films 112 and 113 may be attached to the polarizer 111 in a manner of wrapping around both surfaces of the polarizer 111 with the polarizer 111 interposed therebetween. Alternatively, as shown in (b) of FIG. 8, one base film 112 may be attached to one surface of the polarizer 111.

The first and second base films 112 and 113 are designed to extend from left and right ends of the active area AA to a predetermined extension EA in order to protect the polarizer 111. A width of the extension EA is set to a width that covers the side of the display device using the base films 112 and 113 or a width that covers the side and the edge of the display device using the base films 112 and 113. At least one of the first and second base films 112 and 113 includes the extensions EA extending from the left end or the right end of the active area AA to the outside. The extensions EA on both sides of the first and second base films 112 and 113 extend to the side or the back surface of the display device and are attached to the side or the back surface of the display device using a pressure sensitive adhesive (PSA) 118. Triacetyl cellulose (TAC) film or an acrylic film may be used as the first and second base films 112 and 113. Other materials may be used for the base films 112 and 113. For example, the first and second base films 112 and 113 may be formed of a transparent optical film. Examples of the transparent optical film include cellulose ester film, polyester film (for example, polyethylene terephthalate (PET) film or polyethylene naphthalate (PEN) film), polycarbonate (PC) film, polyallylate film, polysulfone (including polyethersulfone (PES)), norbornene resin film, polyolefin film (for example, polyethylene film or polypropylene film), cellophane, cellulose diacetate film, cellulose acetate butyrate film, polyvinylidene chloride film, polyvinyl alcohol film, ethylene vinyl alcohol film, polystyrene film, polycarbonate film, cycloolefin polymer film, polymethylpentene film, polyetherketone film, polyether ketone imide film, polyamide-based film, fluorine resin film, nylon film, polymethylmethacrylate film, polyacetate film, and polyacrylic film.

A protective film 114 is attached to a front surface of the first base film 112 using an adhesive. The protective film 114 is a film for temporarily protecting the polarizing plate 110 and may be removed by a user. The PSA 118 is applied to a back surface of the second base film 113 (or to the back of the polarizer 111), and a release film 119 is attached to the PSA 118. The release film 119 is temporarily attached to the PSA 118, so that the PSA 118 is not polluted. When the polarizing plate 110 is attached to the front surface and the side of the display device, the release film 119 is removed. The protective film 114 and the release film 119 may be manufactured using polyethylene terephthalate (PET) film. Other materials may be used.

Figure 14:
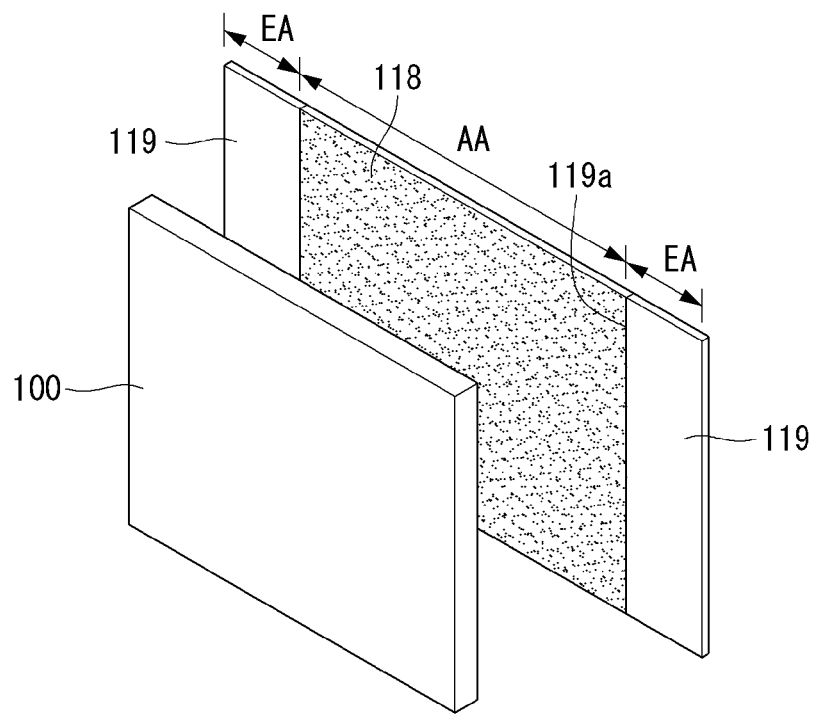
FIG. 14 is a perspective view showing a state where a polarizing plate, according to an embodiment of the invention, and a display panel are aligned and a release film is removed from the polarizing plate when the polarizing plate is attached to the display panel.

The release film 119 is cut at a boundary between the active area AA and the extension EA using a laser beam. The release film 119 may be separated at the boundary between the active area AA and the extension EA at the cutting line 119a. When the polarizing plate 110 is attached to the upper substrate of the display panel 100, the PSA 118 of the active area AA is exposed, but the PSA 118 of the extension EA may be covered by the release film 119. Thus, when the polarizing plate 110 is attached to the upper substrate of the display panel 100, a portion of the release film 119 may prevent the PSA 118 of the extension EA from being polluted by a foreign substance as shown in FIG. 14.

Figure 10:
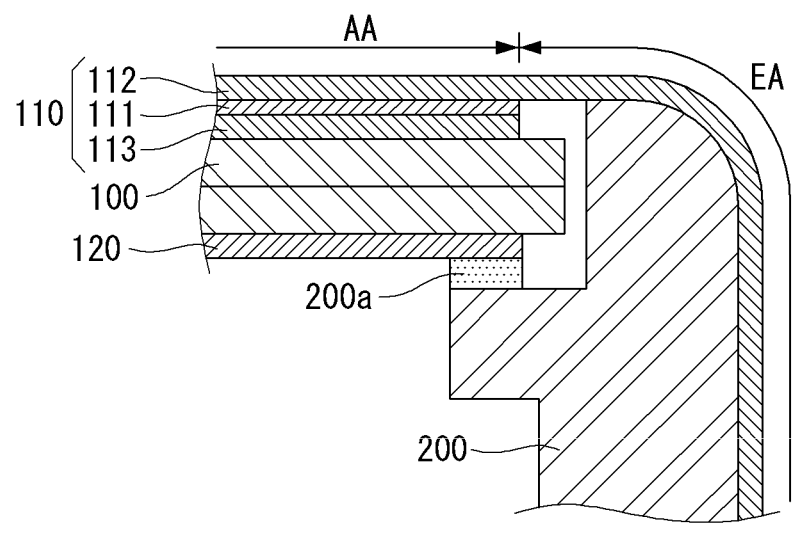
FIG. 10 is a cross-sectional view showing an example where the polarizing plate shown in FIG. 8 is attached to a display device.
Figure 10:
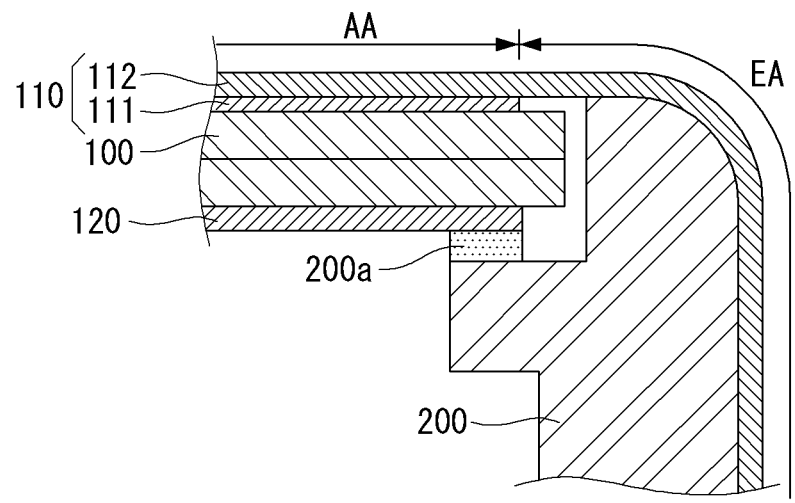
Figure 11:
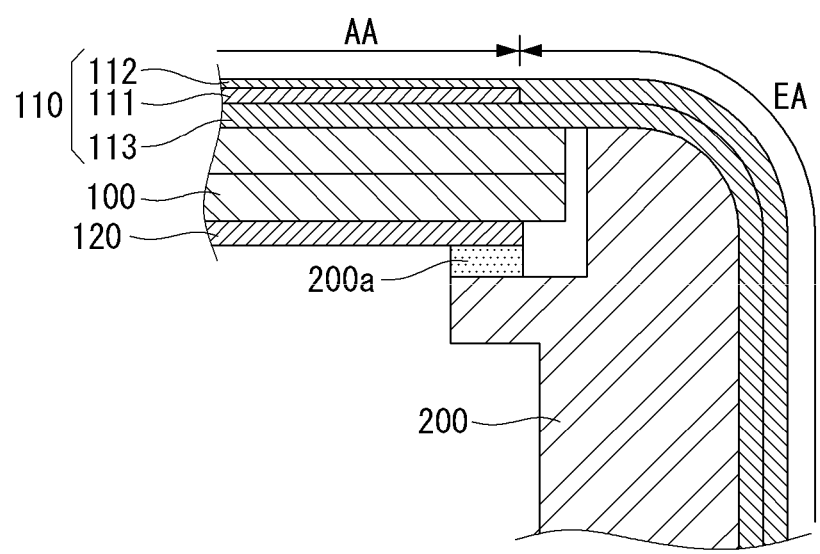
FIG. 11 is a cross-sectional view showing an example where the polarizing plate shown in FIG. 9 is attached to a display device.

A black matrix BM 117 may be formed in the extension EA of the polarizing plate 110. When the polarizing plate 110 connects the front surface and the side of the display device as shown in FIGS. 10 and 11, the black matrix BM 117 serves as a cover, which prevents the case member from being seen at the side of the display device. The black matrix BM 117 may be formed of a resin, to which a black pigment is added. The black matrix BM 117 may be formed at any position inside the extension EA of the polarizing plate 110. For example, as shown in FIGS. 8 and 9, the black matrix BM 117 may be formed on the base films 112 or 113, the adhesives 115 or 116, or the PSA 118

As shown in FIGS. 10 and 11, the polarizing plate 110 according to an embodiment of the invention may be an upper polarizing plate attached to the upper substrate of the display device. FIG. 10 is a cross-sectional view showing an example where the upper polarizing plate 110 shown in FIG. 8 is attached to the display device. FIG. 11 is a cross-sectional view showing an example where the upper polarizing plate shown in FIG. 9 is attached to the display device. FIGS. 10 and 11 show a portion of an upper edge of the display device.

As shown in FIG. 10, the first base film 112 of the upper polarizing plate 110 connects the front surface and the side of the display device and is attached to the side or the back surface of the display device using an adhesive. The polarizer 111 is disposed at the front surface of the display device and does not extend to the side or the back surface of the display device. Because the extension EA bending at the upper polarizing plate 110 does not include the polarizer 111 and the second base film 113, a thickness of the extension EA is greatly reduced. Thus, the extension EA of the upper polarizing plate 110 easily bends and may be attached to the side or the back surface of the display device without a break, a crack, or a gap. In FIG. 10, (a) is a cross-sectional view showing in detail one edge of the display device when the upper polarizing plate 110 having the structure shown in (a) of FIG. 8 connects the front surface and the side of the display device; and (b) is a cross-sectional view showing in detail one edge of the display device when the upper polarizing plate 110 having the structure shown in (b) of FIG. 8 connects the front surface and the side of the display device.

As shown in FIG. 11, the first and second base films 112 and 113 of the upper polarizing plate 110 connect the front surface and the side of the display device and are attached to the side or the back surface of the display device using the adhesive. The polarizer 111 is disposed at the front surface of the display device and does not extend to the side or the back surface of the display device. Because the extension EA bending at the upper polarizing plate 110 does not include the polarizer 111, a thickness of the extension EA is greatly reduced. Thus, the extension EA of the upper polarizing plate 110 easily bends and may be attached to the side or the back surface of the display device without a break, a crack, or a gap.

The side of the display device is configured as a guide panel 200 having a curved upper edge. The first and second base films 112 and 113 of the upper polarizing plate 110 are attached to an outer surface of the guide panel 200. The guide panel 200 includes a stepped jaw part for supporting the display panel 100 on an inner surface of the guide panel 200. A buffer pad 200a may be formed between the stepped jaw part of the guide panel 200 and the display panel 100. The buffer pad 200a may be manufactured using a silicon pad.

Figure 12:
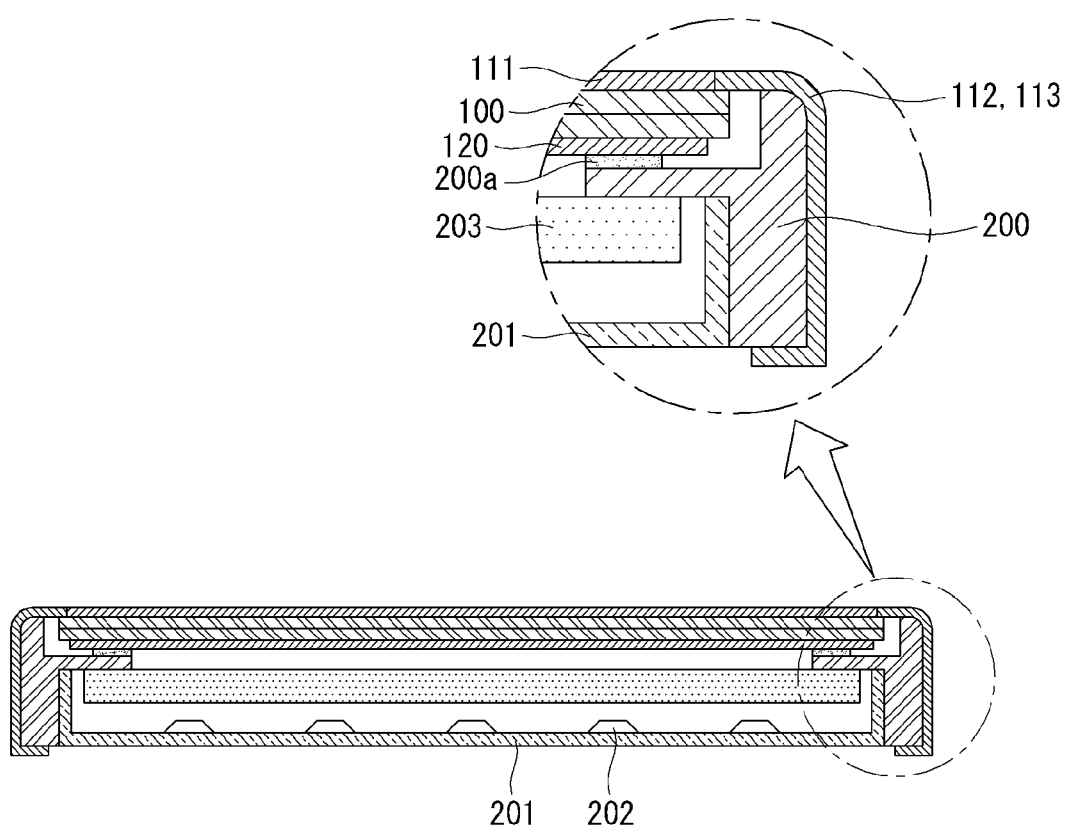
FIG. 12 is a cross-sectional view showing a liquid crystal module according to an embodiment of the invention.

The method for connecting the front surface and the side of the display device using the polarizing plate illustrated in FIGS. 10 and 11 may be applied to the liquid crystal display. FIG. 12 is a cross-sectional view showing a liquid crystal module of the liquid crystal display according to the embodiment of the invention.

As shown in FIG. 12, the liquid crystal module includes a display panel 100, a backlight unit for irradiating light onto the display panel 100, and case members for assembling the display panel 100 and the backlight unit into one body.

The display panel 100 may be implemented in any known liquid crystal mode including a twisted nematic (TN) mode, a vertical alignment (VA) mode, an in-plane switching (IPS) mode, and a fringe field switching (FFS) mode. The backlight unit may be classified as an edge type backlight unit or a direct type backlight unit. In an edge type backlight unit, light sources are positioned opposite the side of a light guide plate, and optical sheets are positioned between the display panel 100 and the light guide plate. In the edge type backlight unit, the light sources irradiate light onto one side of the light guide plate, and the light guide plate converts a line light source or a point light source into a surface light source. In a direct type backlight unit, light sources are positioned under the display panel 100. The direct type backlight unit includes a bottom cover 201 receiving light sources 202 such as a light emitting diode (LED), a diffusion plate 203 positioned on the bottom cover 201, and a plurality of optical sheets positioned between the diffusion plate 203 and the display panel 100. The optical sheets include one or more prism sheets and one or more diffusion sheets. Hence, the optical sheets diffuse light incident from the diffusion plate and refract a traveling path of the light at an angle substantially vertical to a light-incident surface of the display panel 100.

The case members include the guide panel 200 for supporting the display panel 100 and a bottom cover 201 for supporting the backlight unit. A top case for reducing the bezel is omitted in the liquid crystal module according to an embodiment of the invention.

Because an organic light emitting diode display includes a self-emission element, the backlight unit illustrated in FIG. 12 is not necessary.

Figure 13:
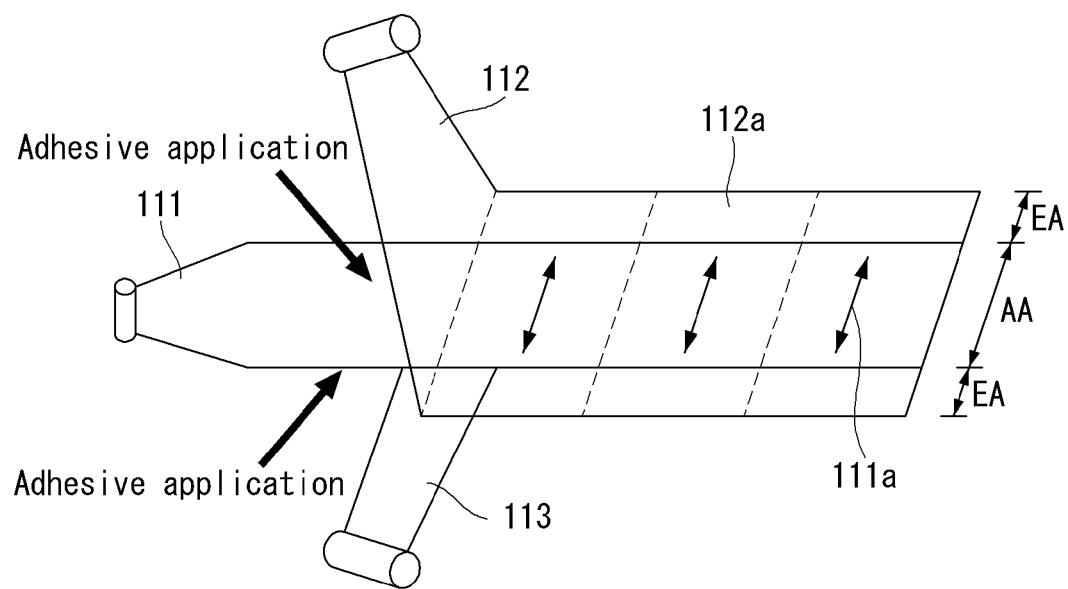
FIG. 13 is a perspective view showing a method for manufacturing a polarizing plate according to an embodiment of the invention.

FIG. 13 is a perspective view showing a method for manufacturing the polarizing plate according to an embodiment of the invention.

As shown in FIG. 13, a width of a film for the polarizer 111 is set to be suitable for the active area AA. In FIG. 13, an arrow denotes a stretching direction of the film for the polarizer 111. The base films 112 and 113 are wider than the polarizer 111 by the extension EA and are attached to the front surface and the back surface of the polarizer 111. The base films 112 and 113 are wider than the polarizer 111 by the extension EA extending from each of the left and right ends of the polarizer 111. Namely, a width of each of the base films 112 and 113 is greater than a width of the polarizer 111 by '+2EA'.

FIG. 14 is a perspective view showing a state where the polarizing plate and the display panel are aligned and the release film is removed from the polarizing plate when the polarizing plate, according to an embodiment of the invention, is attached to the display panel.

Figure 15:
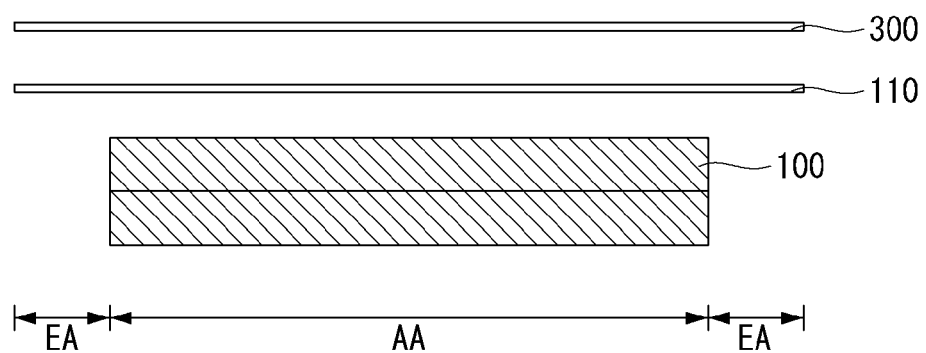
FIG. 15 shows an example where a touch screen is attached to a polarizing plate according to an embodiment of the invention.

The display device according to the embodiment of the invention may include a touch screen. Sensors of the touch screen may be mounted inside the pixel array of the display device or may be attached to the display device. As shown in FIG. 15, when a touch screen 300 is attached to the display panel 100, at least one film constituting the touch screen 300 includes an extension EA in the same manner as the polarizing plate 110. A portion of the extension EA of each of the polarizing plate 110 and the touch screen 300 bends and is attached to the side or the back surface of the display device, thereby connecting the front surface and the side of the display device.

Figure 16:
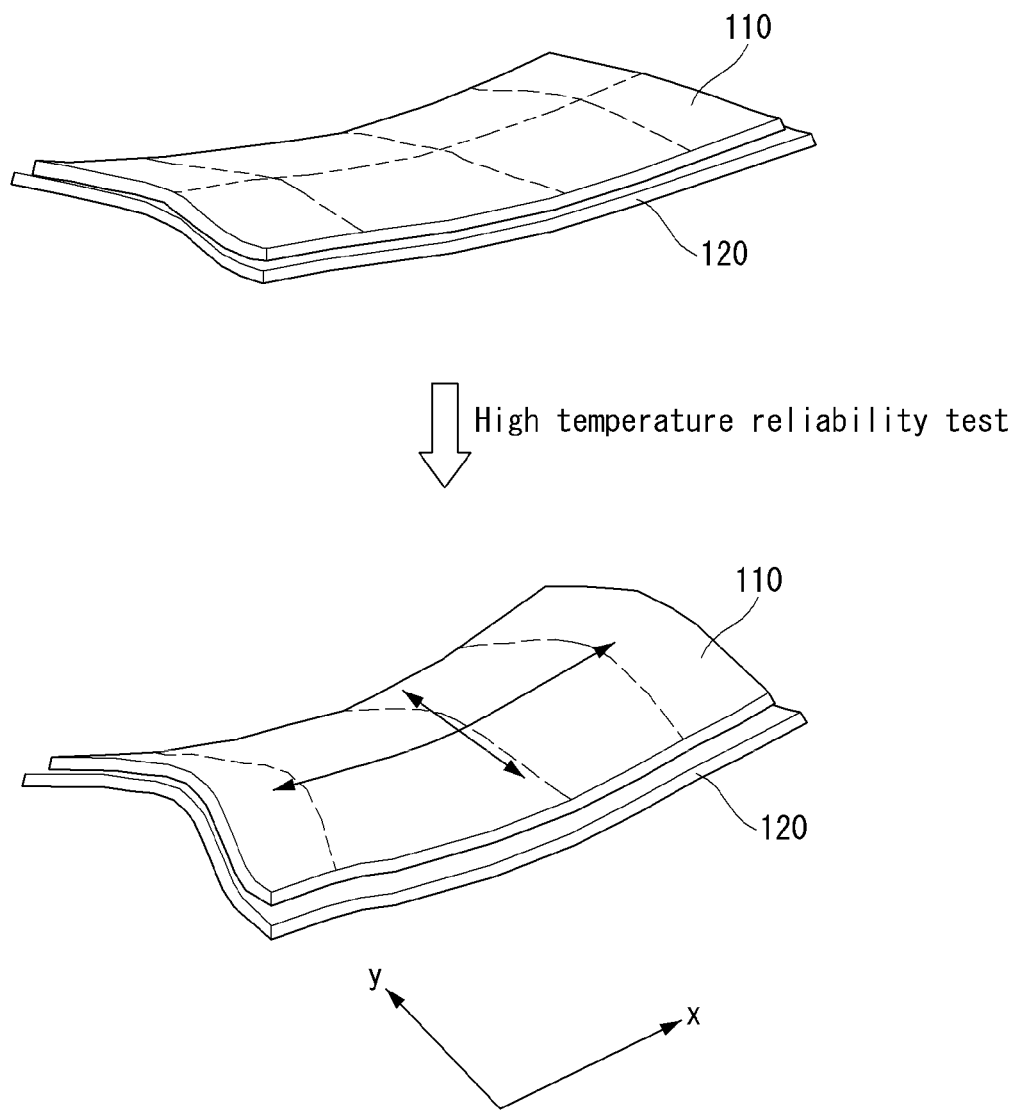
FIG. 16 is a perspective view showing a deformation of a display panel resulting from a polarizing plate in a high-temperature reliability test of a display device.

After the polarizing plates 110 and 120 are attached to the display panel 100, the display panel 100 is put into a high-temperature chamber and is tested for the reliability at a high temperature. In this instance, as shown in FIG. 16, the display panel 100 tends to be deformed due to the polarizing plates 110 and 120. This is because the polarizing plates 110 and 120 attached to the display panel 100 contract in the stretching direction at high temperature. In the IPS mode, the stretching direction of the upper polarizing plate 110, i.e., the stretching direction of the polarizer 111 is a transverse direction (e.g., x-axis direction) of the display panel 100, and the stretching direction of the lower polarizing plate 120 is a longitudinal direction (e.g., y-axis direction) of the display panel 100. Thus, when viewing the front surface of the display panel 100 after the high-temperature reliability test, the display panel 100 bends forward along the transverse direction and bends backward along the longitudinal direction. Namely, the display panel 100 may deforms into a shape like a saddle.

Figure 17:
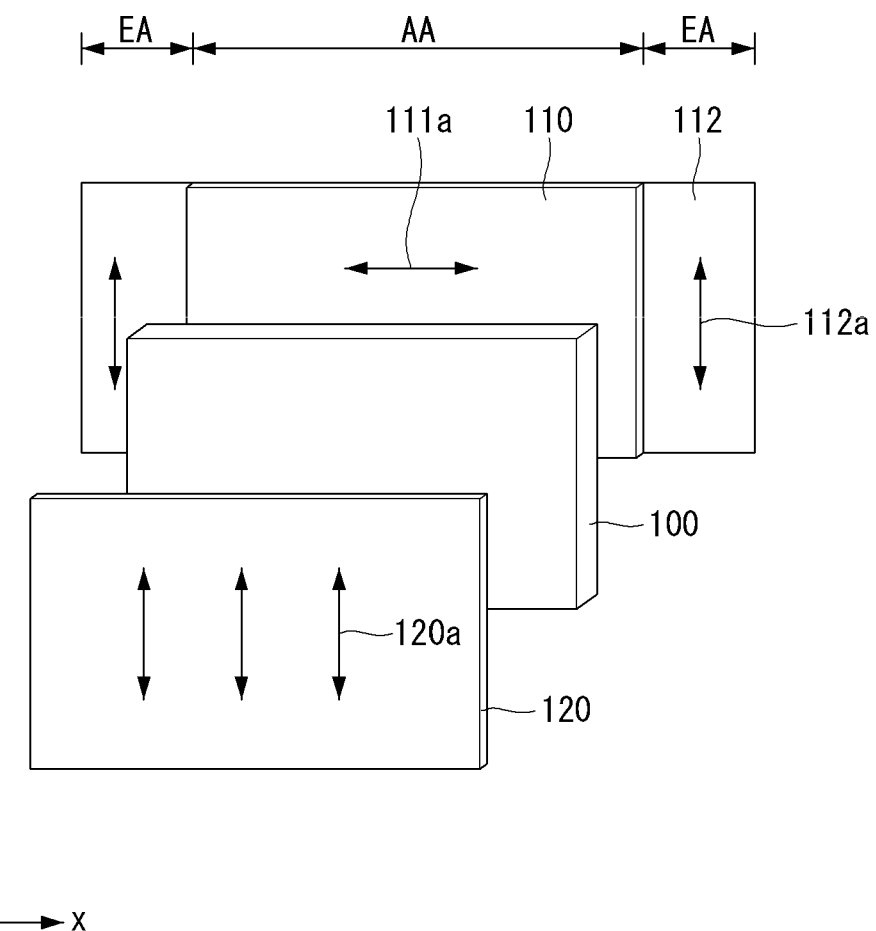
FIGS. 17 to 19 are perspective views showing a stretching direction of a base film of a polarizing plate according to an embodiment of the invention.
Figure 18:
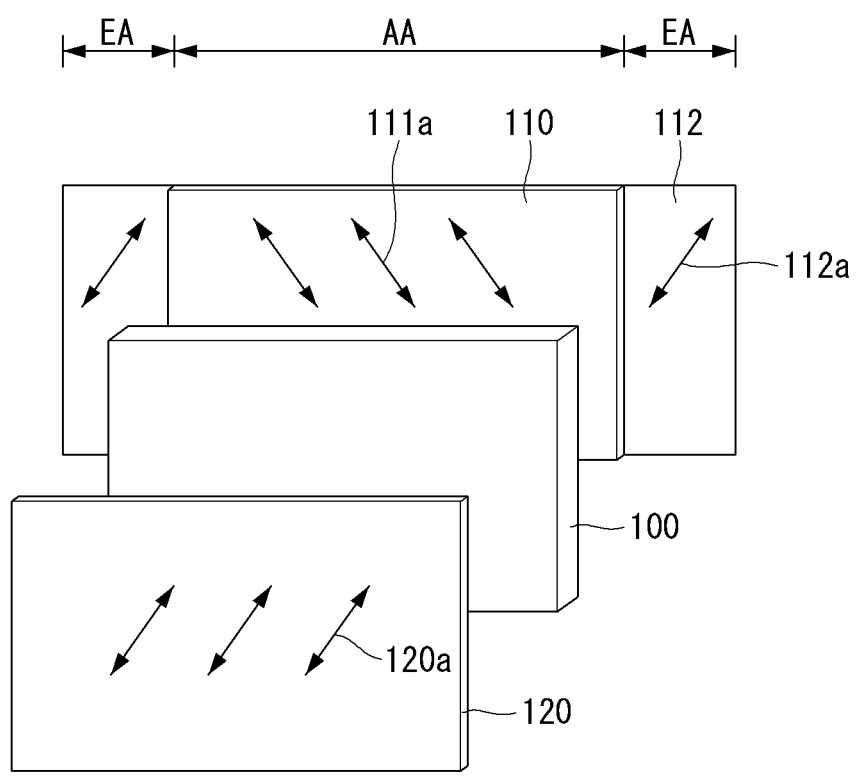
Figure 19:
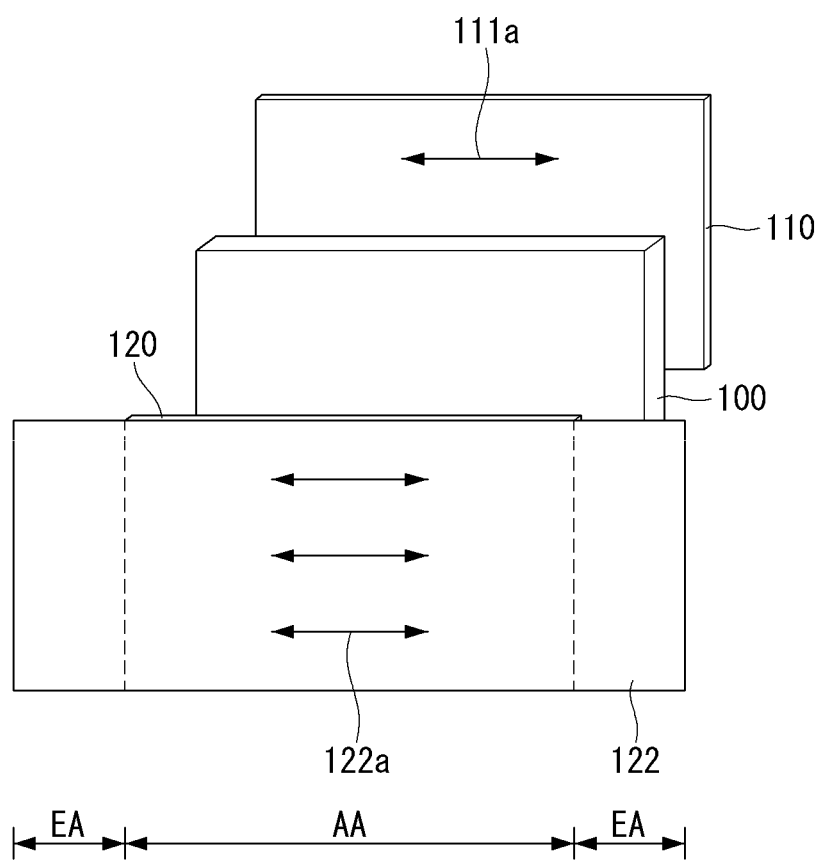

As shown in FIGS. 17 to 19, an embodiment of the invention stretches the base films of the polarizing plates 110 and 120, thereby preventing the deformation of the display panel 100 and preventing light leakage after the high-temperature reliability test. This is because the contraction force of the polarizing plate attached to one surface of the display panel 100 cancels out the force of the polarizing plate attached to the other surface of the display panel 100.

FIGS. 17 to 19 are perspective views showing the stretching direction of the base films of the polarizing plates 110 and 120 according to the embodiment of the invention.

As shown in FIGS. 17 and 18, in the display panel of the IPS mode or the FFS mode, the base film 112 of the upper polarizing plate 110 is stretched in the same direction 112a as a polarizer stretching direction 120a of the lower polarizing plate 120. Thus, the base film 112 of the upper polarizing plate 110 has the stretching direction 112a. In the high-temperature reliability test, the contraction force of the lower polarizing plate 120 cancels out the force acting on the base film 112 of the upper polarizing plate 110 along the stretching direction 112a. A polarizer stretching direction 111a of the upper polarizing plate 110 is perpendicular to the polarizer stretching direction 120a of the lower polarizing plate 120.

As shown in FIG. 19, the lower polarizing plate 120 includes a base film 122, which is extended so that it wraps around the backlight unit and is attached to the cover bottom. The base film 122 wraps around the side and the back surface of the bottom cover 201 (referring to FIG. 12) constituting the backlight unit and is attached to the back surface of the bottom cover 201. The base film 122 of the lower polarizing plate 120 is stretched, so as to prevent the deformation of the display panel resulting from the high-temperature reliability test. A stretching direction 122a of the base film 122 is the same as the polarizer stretching direction 111a of the upper polarizing plate 110. Thus, in the high-temperature reliability test, the contraction force of the lower polarizing plate 120 cancels out the force acting on the base film 122 of the lower polarizing plate 120 along the stretching direction 122a. The polarizer stretching direction 111a of the upper polarizing plate 110 is perpendicular to the polarizer stretching direction 120a of the lower polarizing plate 120 in the same manner as FIGS. 17 and 18.

As described above, the embodiment of the invention removes a component that increases the bezel in the case member and connects the front surface and the side of the display device using the base film of the polarizing plate without the polarizer of the polarizing plate. As a result, the display device according to an embodiment of the invention can implement a narrow bezel and also can prevent damage and light leakage from the polarizing plate.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a display panel;
    a case member disposed to a side of the display panel, the case member including a stepped portion protruding from an inner surface of the case member toward the display panel, the stepped portion supporting a rear surface of the display panel; and
    a polarizing plate attached to a front surface of the display panel opposite the rear surface of the display panel, and to an outer surface of the case member opposite the inner surface of the case member, wherein the polarizing plate includes:
        a first base film disposed on the front surface of the display panel, the first base film including a first extension portion disposed on the and on the outer surface of the case member,
        a second base film disposed on the front surface of the display panel, the second base film including a second extension portion disposed between the outer surface of the case member and the first extension portion of the first base film, and
        a first polarizer disposed between the first base film and the second base film at the front surface of the display panel.

2. The display device of claim 1, wherein the first base film is attached to a front surface of the first polarizer, the first extension portion extending wider than the first polarizer, the first extension portion bending around both ends of the display panel, and the first extension portion being attached to the outer surface of the case member and a back surface of the case member.

3. The display device of claim 2, wherein the polarizing plate includes a black matrix disposed between the display panel and the first extension portion of the first base film.

4. The display device of claim 1,
    wherein the first polarizer includes a first plurality of polymer chains oriented in a first stretching direction, the first polarizer stretching in the first stretching direction, and
    wherein the first base film is stretched in a second stretching direction perpendicular to the first stretching direction of the first polarizer.

5. The display device of claim 4, further comprising:
    a second polarizing plate attached to a back surface of the display panel, the second polarizing plate comprising a second polarizer including a second plurality of polymer chains oriented in the second stretching direction of the first base film, the second polarizer stretching in the second stretching direction.

6. A display device comprising:
    a display panel;
    a case member disposed to a side of the display panel, the case member including a stepped portion protruding from an inner surface of the case member toward the display panel, the stepped portion supporting a rear surface of the display panel;
    a first polarizing plate attached to a front surface of the display panel opposite the rear surface of the display panel and to an outer surface of the case member opposite the inner surface of the case member; and
    a second polarizing plate attached to the rear surface of the display panel,
    wherein the first polarizing plate includes:
        a first polarizer disposed at the front surface of the display panel, the first polarizer including a first plurality of polymer chains oriented in a first stretching direction, the first polarizer stretching in the first stretching direction, and
        a first base film attached to the first polarizer, the first base film disposed on the front surface of the display panel and on the outer surface of the case member, the first base film is stretched in a second stretching direction perpendicular to the first stretching direction of the first polarizer.

7. The display device of claim 6,
    wherein the second polarizing plate comprises a second polarizer including a second plurality of polymer chains oriented in the second stretching direction, the second polarizer stretching in the second stretching direction.

8. The display device of claim 7, wherein the second polarizing plate includes a second base film stretched parallel to the first stretching direction of the first polarizer and perpendicular to the second stretching direction of the second polarizer.

9. The display device of claim 3, wherein the black matrix is disposed between the first base film and a pressure sensitive adhesive connecting the polarizing plate to the display panel.

10. The display device of claim 3,
    wherein the black matrix is disposed between the first base film and the second base film.

11. The display device of claim 5, wherein the second polarizing plate includes a third base film stretched parallel to the first polarizer stretching direction of the first polarizer and perpendicular to the stretching direction of the second polarizer.

12. The display device of claim 11, further comprising a bottom cover having a side surface inside the inner surface of the case member and a back surface parallel to the display panel, wherein the third base film wraps around the side surface and the back surface of the bottom cover.

13. The display device of claim 8, further comprising a bottom cover having a side surface inside the inner surface of the case member and a back surface parallel to the display panel, wherein the second base film wraps around the side surface and the back surface of the bottom cover.

14. The display device of claim 6, wherein the first polarizer absorbs light vibrating in the first stretching direction.

15. The display device of claim 7, wherein the second polarizer absorbs light vibrating in the second stretching direction.

\* \* \* \* \*